(12) United States Patent
Shin et al.

(10) Patent No.: US 11,985,774 B2
(45) Date of Patent: May 14, 2024

(54) DISPLAY DEVICE

(71) Applicant: Samsung Display Co., Ltd., Yongin-si (KR)

(72) Inventors: Jaiku Shin, Hwaseong-si (KR); Sung Chul Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 456 days.

(21) Appl. No.: 17/218,672

(22) Filed: Mar. 31, 2021

(65) Prior Publication Data

US 2022/0039274 A1 Feb. 3, 2022

(30) Foreign Application Priority Data

Jul. 31, 2020 (KR) ........................ 10-2020-0095820

(51) Int. Cl.
*H05K 5/02* (2006.01)
*G02F 1/1333* (2006.01)
*H05K 5/00* (2006.01)
*B32B 3/26* (2006.01)
*B32B 7/022* (2019.01)
*B32B 7/14* (2006.01)
(Continued)

(52) U.S. Cl.
CPC ..... *H05K 5/0217* (2013.01); *G02F 1/133305* (2013.01); *H05K 5/0017* (2013.01); *B32B 3/266* (2013.01); *B32B 7/022* (2019.01); *B32B 7/14* (2013.01); *B32B 15/08* (2013.01); *B32B 27/08* (2013.01); *B32B 2307/546* (2013.01); *B32B 2457/20* (2013.01)

(58) Field of Classification Search
CPC ............... B32B 3/266; B32B 2457/20; B32B 2457/202; B32B 2457/204; B32B 2457/206; B32B 2457/208; G02F 1/133305; H05K 5/0217; H05K 5/0226
See application file for complete search history.

(56) References Cited

U.S. PATENT DOCUMENTS 10,754,382 B2 8/2020 Nam et al.
10,838,457 B2 11/2020 Yu et al.
(Continued)

FOREIGN PATENT DOCUMENTS

KR 1020190124844 A 11/2019
KR 1020200019800 A 2/2020
(Continued)

*Primary Examiner* — Zachary M Davis
(74) *Attorney, Agent, or Firm* — CANTOR COLBURN LLP

(57) ABSTRACT

A display device includes a display module including a folding area, a plate which is under the display module and includes a bending portion corresponding to the folding area and a plurality of openings defined in the bending portion, a first plate and a second plate portion extending from opposing sides of the bending portion, a support layer which is under the bending portion and includes a first support member and a second support member spaced apart from each other, and a cushion layer including a first cushion member corresponding to the first plate portion and a second cushion member corresponding to the second plate portion. Each of the first support member and the second support member has a modulus greater than a modulus of each of the first cushion member and the second cushion member.

23 Claims, 12 Drawing Sheets

(51) Int. Cl.
   *B32B 15/08*     (2006.01)
   *B32B 27/08*     (2006.01)

(56)  References Cited

U.S. PATENT DOCUMENTS

| | | | |
|---|---|---|---|
| 2018/0097197 A1* | 4/2018 | Han | ......................... H05K 5/03 |
| 2019/0334114 A1 | 10/2019 | Park | |
| 2020/0057471 A1* | 2/2020 | Nam | ..................... G06F 1/1641 |
| 2020/0089277 A1 | 3/2020 | Park et al. | |
| 2020/0119290 A1 | 4/2020 | Shin | |

FOREIGN PATENT DOCUMENTS

| | | | |
|---|---|---|---|
| KR | 1020200032793 A | 3/2020 | |
| KR | 1020200042579 A | 4/2020 | |
| KR | 1020200089358 A | 7/2020 | |

\* cited by examiner

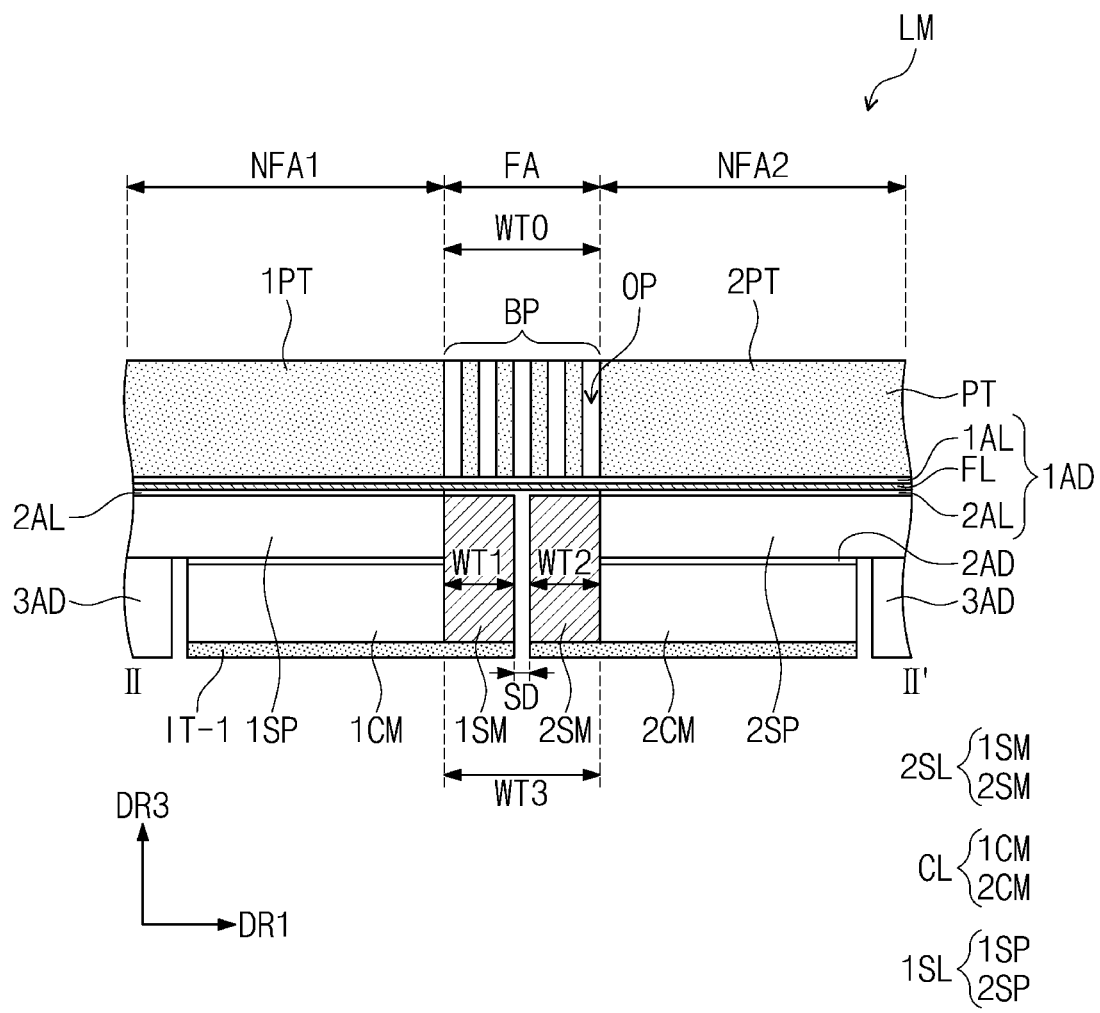

DISPLAY DEVICE

This application claims priority to Korean Patent Application No. 10-2020-0095820, filed on Jul. 31, 2020, and all the benefits accruing therefrom under 35 U.S.C. § 119, the contents of which are hereby incorporated by reference in its entirety.

BACKGROUND

1. Field

The disclosure relates to a display device. More particularly, the disclosure relates to a display device having improved impact resistance.

2. Description of the Related Art

A display device displays various images through a display screen to provide information to outside the display device. In general, the display device displays the information in an allocated area of the display screen. Flexible display devices including a flexible display panel that is foldable are being developed. Different from a rigid display device, the flexible display device is foldable, rollable or bendable. The flexible display device, which is transformable into various shapes, is easy to carry and improves convenience of using the display device regardless of the original size of the display screen thereof.

SUMMARY

One or more embodiment provides a display device having improved impact resistance especially in a folding area of the display device.

An embodiment provides a display device including a display module in which a folding area is defined, a plate under the display module and including a bending portion overlapping the folding area and provided with a plurality of grid patterns defined therethrough, a first plate portion and a second plate portion extending from opposing sides of the bending portion, a support layer under the bending portion and including a first support member and a second support member spaced apart from each other, and a cushion layer including a first cushion member under the first plate portion and a second cushion member under the second plate portion. Each of the first support member and the second support member has a modulus greater than a modulus of each of the first cushion member and the second cushion member.

The display device may further include a first support plate between the plate and the support layer, and a second support plate between the plate and the support layer and spaced apart from the first support plate.

The modulus of each of the first and second support members may be equal to or greater than about 1 gigapascal (GPa).

The first and second support members may include polyethylene terephthalate ("PET"), polyimide ("PI") or polycarbonate ("PC").

The support layer may be in the folding area, and a sum of a width of the first support member and a width of the second support member may be smaller than a width of the bending portion.

The grid patterns may include a plurality of openings spaced apart from each other.

The display device may further include a first adhesive member between the plate and the first and second support plates. The first adhesive member may include a first adhesive layer in contact with the plate, a second adhesive layer including a plurality of adhesive members spaced apart from each other and in contact with the first and second support plates, respectively, and an auxiliary member between the first and second adhesive layers.

The second adhesive layer may include a non-adhesive portion between the adhesive members and overlapping the bending portion, and the non-adhesive portion may have a width equal to a width of the bending portion.

The support layer may overlap the bending portion and be under the first and second support plates, and the cushion layer and the support layer may be coplanar with each other. The first cushion member and the first support member may be under the first support plate, and the second cushion member and the second support member may be under the second support plate.

The cushion layer may have a thickness which is substantially the same as a thickness of the support layer.

The support layer may have a thickness greater than a thickness of the first and second support plates and smaller than a thickness of the plate.

The display device may further include an adhesive member under the first support plate and the second support plate and extending further from the first support plate and the second support plate than the cushion layer, and the support layer may have a thickness smaller than a thickness of the adhesive member.

Each of the first support member and the second support member may be coplanar with each of the first support plate and the second support plate.

The support layer may have a thickness which is substantially the same as a sum of a thickness of each of the first and second support plates and a thickness of the cushion layer. The display device may further include an insulating member under the cushion layer and the support layer, and the first and second support members may be attached to the insulating member.

The insulating member may have a modulus which is substantially the same as the modulus of the first support member or the second support member.

The first support member and the second support member may respectively extend to define an extended portion which faces the first support plate and the second support plate with the cushion layer therebetween.

An embodiment provides a display device including a display module including a first non-folding area, a second non-folding area and a folding area at which the display module is foldable, a plate under the display module and including a bending portion through which a plurality of grid patterns overlapping the folding area is defined, a first support plate under the plate and overlapping the first non-folding area, a second support plate under the plate and overlapping the second non-folding area, a first cushion member under the first support plate and overlapping the first non-folding area, a first support member under the first support plate and overlapping the folding area, a second cushion member under the second support plate and overlapping the second non-folding area, and a second support member under the second support plate and overlapping the folding area. Each of the first and second support members has a modulus greater than a modulus of each of the first and second cushion members.

The modulus of each of the first and second support members may be equal to or greater than about 1 GPa.

The folding area may have a width which is substantially the same as a width of the bending portion.

The first and second support plates may include a metal material.

An embodiment provides provide a display device including a display module in which a folding area is defined, a plate under the display module and including a bending portion overlapping the folding area and provided with a plurality of grid patterns defined therethrough, a first support layer under the plate and including a first support plate and a second support plate spaced apart from each other, and a second support layer overlapping the bending portion and including a first support member under the first support plate and a second support member under the second support plate. Each of the first support member and the second support member has a modulus equal to or greater than about 1 GPa.

According to the above, the display device has improved impact resistance.

According to the above, the plate of the display device includes the bending portion defined to correspond to the folding area of the display module and having a grid structure. The display device includes the support member having a material with high rigidity to support the bending portion of the plate in place of the cushion layer, and thus, the impact resistance in the folding area of the display device is improved.

BRIEF DESCRIPTION OF THE DRAWINGS

The above and other advantages of the invention will become readily apparent by reference to the following detailed description when considered in conjunction with the accompanying drawings where:

FIG. 7 is a cross-sectional view showing an embodiment of a display device;

DETAILED DESCRIPTION

Figure 1:
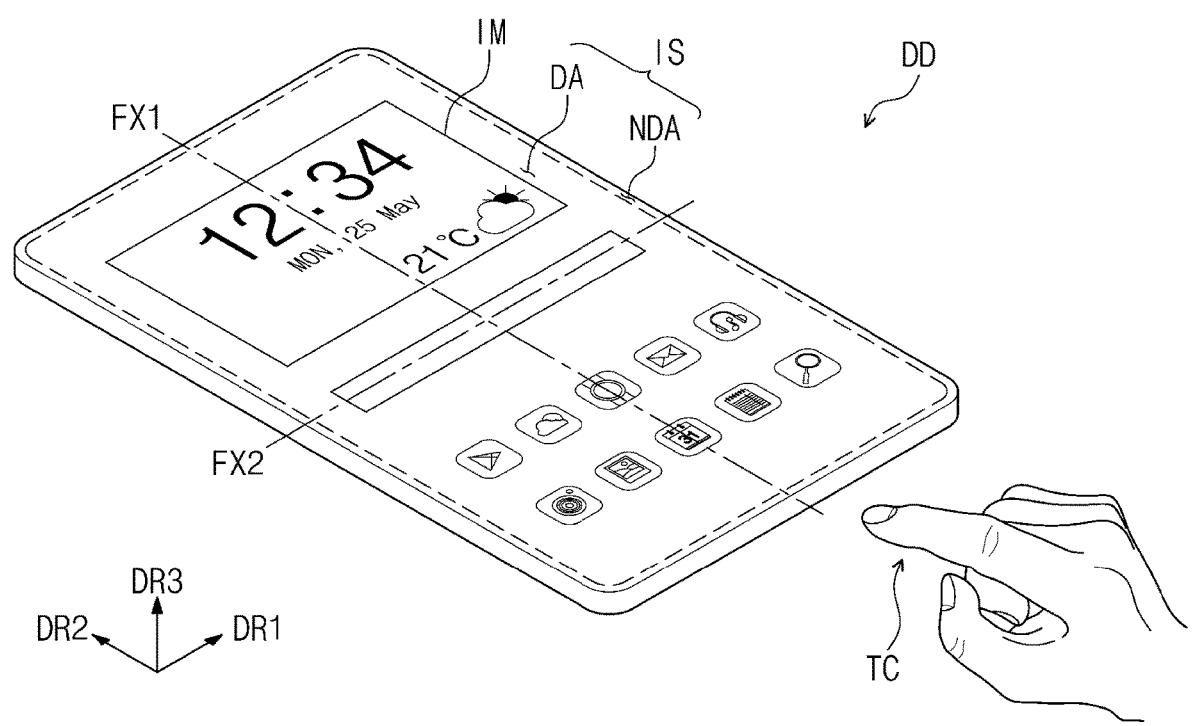
FIG. 1 is a perspective view showing an embodiment of a display device which is flat or unfolded.

In the disclosure, it will be understood that when an element or layer is referred to as being related to another element such as being "on," "connected to" or "coupled to" another element or layer, it can be directly on, connected or coupled to the other element or layer or intervening elements or layers may be present. In contrast, when an element or layer is referred to as being related to another element such as being "directly on," "directly connected to" or "directly coupled to" another element or layer, no intervening elements or layers are present.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout. In the drawings, the thickness, ratio, and dimension of components are exaggerated for effective description of the technical content.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

The terminology used herein is for the purpose of describing particular embodiments only and is not intended to be limiting. As used herein, the singular forms, "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures.

It will be further understood that the terms "comprises" and/or "comprising" or "includes" and/or "including," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

FIG. 1 is a perspective view showing an embodiment of a display device DD which is unfolded or flat.

Referring to FIG. 1, the display device DD has a rectangular shape with short sides extended along a first direction DR1 and long sides extended along a second direction DR2 which crosses the first direction DR1. However, the planar shape of the display device DD should not be limited to the rectangular shape, and the display device DD may have a variety of planar shapes.

The display device DD may be a foldable electronic device. In detail, the display device DD may be foldable about a folding axis provided in plural including folding axes FX1 and FX2 each extending along a predetermined direction. Hereinafter, the display device DD which is not folded may define a "first state, e.g., non-folding state or non-folded state," and the display device DD which is folded about a folding axis among the folding axes FX1 and FX2 may define a "second state, e.g., folding state or folded state." The folding axes FX1 and FX2 may be rotational axes generated when the display device DD is folded, and the folding axes FX1 and FX2 may be provided or formed by components and structures of the display device DD.

The folding axes FX1 and FX2 may respectively extend along the first direction DR1 or the second direction DR2. The folding axis extending along the second direction DR2 is referred to as a first folding axis FX1, and the folding axis extending along the first direction DR1 is referred to as a second folding axis FX2. The display device DD may include one folding axis among the first and second folding axes FX1 and FX2. That is, the display device DD may be foldable about one of the first and second folding axes FX1 and FX2.

The display device DD may be applied to a large-sized electronic item, such as a television set and a display monitor, and a small and medium-sized electronic item, such as a mobile phone, a tablet computer, a car navigation unit and a game unit. These are merely exemplary, and thus, the display device DD may be applied to other electronic items as long as they do not depart from the concept of the invention.

As shown in FIG. 1, the display device DD may display an image IM at or through a display surface IS defined in a plane which is substantially parallel to a plane defined by the first and second directions DR1 and DR2. The image IM may be displayed in a third direction DR3 crossing each of the first direction DR1 and the second direction DR2. The display surface IS at which the image IM is displayed may correspond to a front surface of the display device DD.

The display surface IS of the display device DD may be divided into a plurality of planar areas. The display surface IS of the display device DD may include a display area DA and a non-display area NDA. Various components and layers of the display device DD may include a display area DA and a non-display area NDA corresponding to those described for the display device DD.

The display area DA may be a planar area at which the image IM is displayed, and the image IM may be viewable from outside the display device DD through the display area DA. The display area DA may have a quadrangular shape. In an embodiment, the non-display area NDA may surround the display area DA. Accordingly, the display area DA may have a shape defined by the non-display area NDA. In an embodiment, and the non-display area NDA may be disposed adjacent to only one side of the display area DA or may be omitted completely. The display device DD may include various embodiments, and should not be limited to a particular embodiment.

The non-display area NDA is a planar area adjacent to the display area DA, and the image IM is not displayed at the non-display area NDA. The display device DD includes a bezel area defined by the non-display area NDA.

The display device DD may sense an external input TC applied thereto from outside the display device DD. The external input TC includes various forms of inputs, such as light, heat or pressure provided from an input tool such as a part of a body, a pen, etc. Referring to FIG. 1, the external input TC is shown as a part of a body (e.g., hand) relative to the front surface. However, the external input TC may be provided in various forms as described above. In addition, the display device DD may sense the external input TC applied to a side surface and/or rear surface of the display device DD depending on a structure of the display device DD, and the invention should not be limited to a particular embodiment.

The display device DD may activate the display surface IS to display the image IM while sensing the external input TC. In an embodiment, a planar area at which the external input TC is sensable is defined within the display area DA at which the image IM is displayed. However, the planar area at which the external input TC is sensable may be defined in the non-display area NDA or may be defined over an entirety of the display surface IS.

Figure 2A:
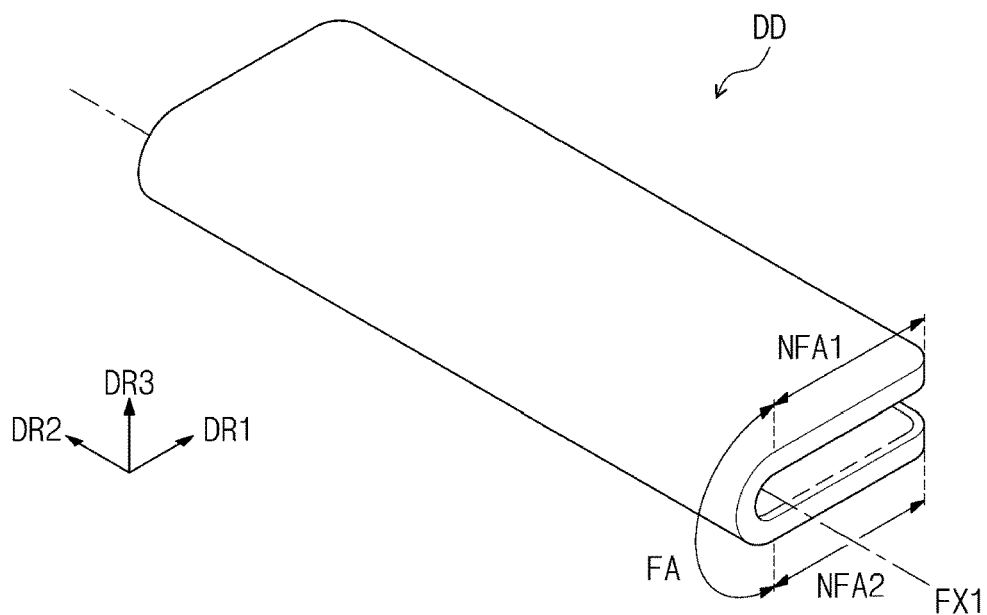
FIG. 2A is a perspective view showing an embodiment of the display device in FIG. 1 which is inwardly folded about a first folding axis.
Figure 2B:
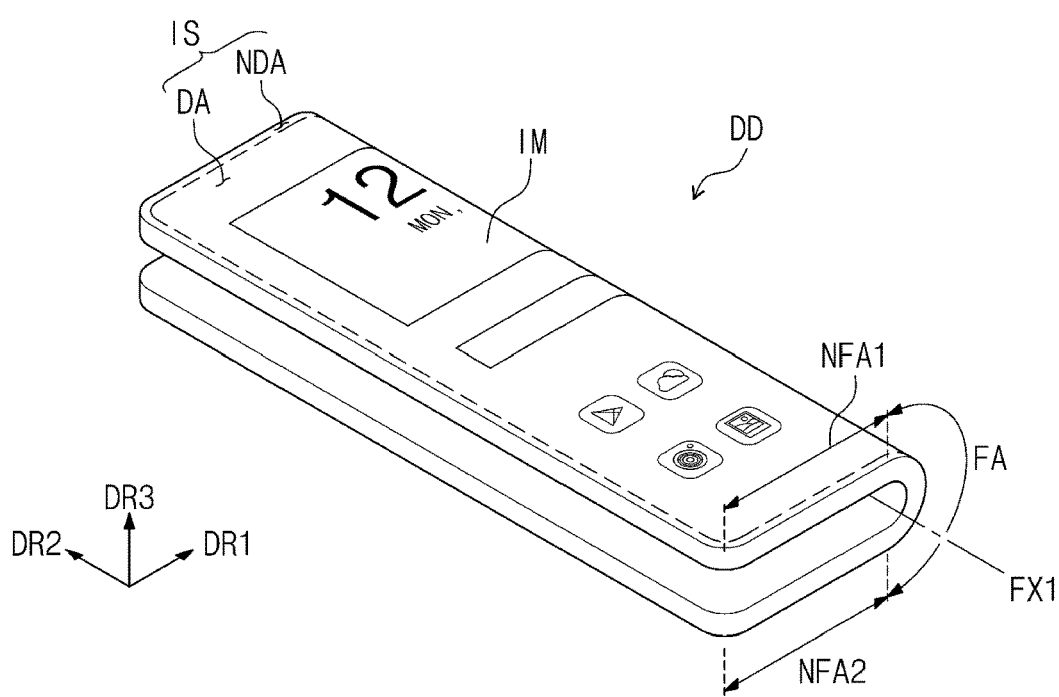
FIG. 2B is a perspective view showing an embodiment of the display device in FIG. 1 which is outwardly folded about the first folding axis.

FIG. 2A is a perspective view showing the display device DD shown in FIG. 1 which is inwardly folded by in-folding about the first folding axis FX1, and FIG. 2B is a perspective view showing the display device DD shown in FIG. 1 which is outwardly folded by out-folding about the first folding axis FX1.

Referring to FIGS. 1 and 2A, the display device DD may be a foldable display device. The display device DD may be foldable about the folding axis, e.g., the first folding axis FX1 and/or the second folding axis FX2 respectively extending along the predetermined direction.

The display device DD may include a plurality of planar areas defined therein according to an operation mode thereof. The planar areas may include a folding area FA and at least one non-folding area. The non-folding area may be provided in plural including non-folding areas. The folding area FA may be defined between the two non-folding areas. The non-folding area is a planar area of the display device DD which is un-bendable or which remains flat even when the display device DD is bent or folded at the folding area FA.

The folding area FA is a planar area at which the display device DD is foldable about the first folding axis FX1 to form a curvature of the display device DD. The first folding axis FX1 may extend along the second direction DR2, e.g., a major axis direction of the display device DD. The folding area FA may be foldable about the first folding axis FX1 and may extend along the second direction DR2.

In an embodiment, the non-folding areas may include a first non-folding area NFA1 and a second non-folding area NFA2. The first non-folding area NFA1 is disposed adjacent to one side of the folding area FA along the first direction DR1, and the second non-folding area FA2 is disposed adjacent to the other side of the folding area FA along the first direction DR1.

The display device DD may be inwardly folded by in-folding or outwardly folded by out-folding. Referring to FIG. 2A, a folding state in which the display device DD is folded to dispose portions of the display surface IS at different non-folding areas to face each other is defined as the in-folding. Referring to FIG. 2B, a folding state in which the display device DD is folded to dispose portions of the display surface IS at different non-folding areas face away from each other and outside of the display device DD is defined as the out-folding.

The in-folding indicates a state in which the display device DD is folded to allow one portion of the display surface IS to face another portion of the display surface IS, and the out-folding indicates a state in which the display device DD is folded to allow one portion of the rear surface to face another portion of the rear surface. The display device DD which is unfolded or flat disposes the rear surface opposite to the front surface along the third direction DR3. A thickness direction of the display device DD and various components or layers thereof may be defined along the third direction DR3.

The display device DD shown in FIG. 2A may be inwardly folded by in-folding to allow a portion of the display surface IS at the first non-folding area NFA1 to face a portion of the display surface IS at the second non-folding area NFA2. As the first non-folding area NFA1 rotates in a clockwise direction about the first folding axis FX1, the display device DD may be inwardly folded. The first folding axis FX1 may be defined at a center of the display device DD along the first direction DR1 to inwardly fold the display device DD such that the first non-folding area NFA1 and the second non-folding area NFA2 are aligned with each other along the third direction DR3.

Referring to FIG. 2B, the display device DD may be outwardly folded by out-folding about the first folding axis FX1. The display device DD may display the image IM when a portion of the display surface IS at the first non-folding area NFA1 and a portion of the display surface IS at the second non-folding area NFA2 face outside of the display device DD. Further, the image IM may also be displayed on a portion of the display surface IS at the folding area FA which faces outside the display device DD.

As shown in FIG. 1, the display device DD may display the image IM while being unfolded or flat. The first non-folding area NFA1, the second non-folding area NFA2 and the folding area FA may respectively display images that provide independent information or may respectively display portions of a single image that provides one information. The first non-folding area NFA1, the folding area FA and the second non-folding area NFA2 may be in order along the second direction DR2, without being limited thereto. In an embodiment, the first non-folding area NFA1, the folding area FA and the second non-folding area NFA2 may be in order along the first direction DR1 or in a direction inclined with respect to the first direction DR1 and/or the second direction DR2.

The display device DD may be provided or manufactured to be both the in-foldable and out-foldable or may be provided or manufactured to be only one among in-foldable and out-foldable.

Figure 3A:
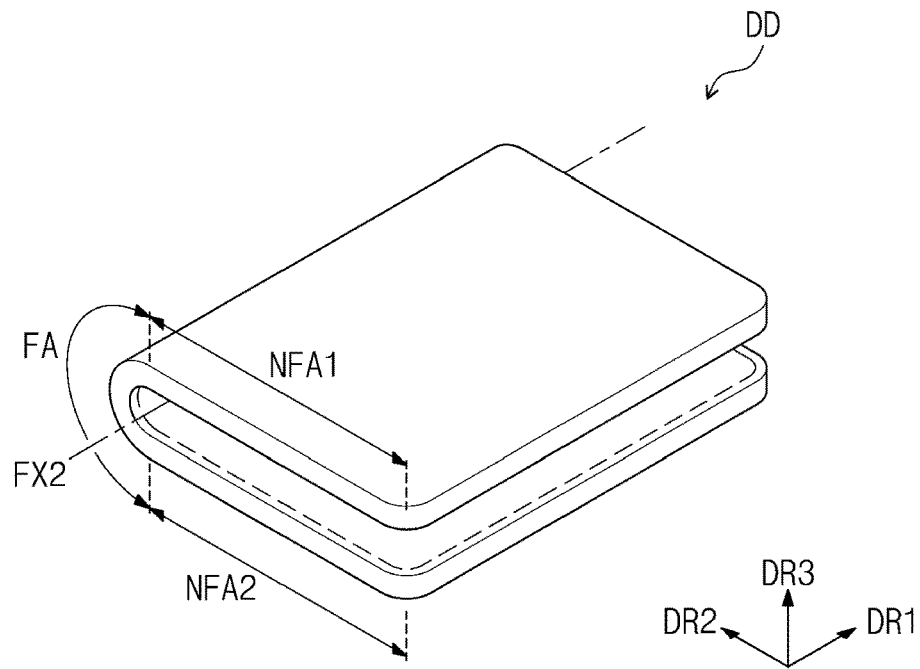
FIG. 3A is a perspective view showing an embodiment of the display device in FIG. 1 which is inwardly folded about a second folding axis.
Figure 3B:
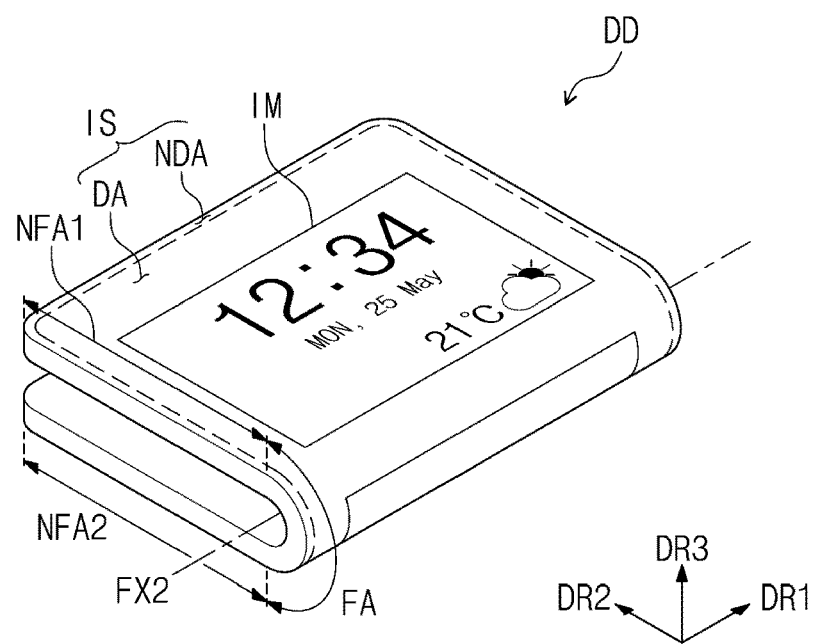
FIG. 3B is a perspective view showing an embodiment of the display device in FIG. 1 which is outwardly folded about the second folding axis.

FIG. 3A is a perspective view showing the display device DD shown in FIG. 1 which is inwardly folded by in-folding about the second folding axis FX2, and FIG. 3B is a perspective view showing the display device DD shown in FIG. 1 which is outwardly folded by out-folding about the second folding axis FX2.

Referring to FIGS. 3A and 3B, the display device DD may be inwardly or outwardly foldable about the second folding axis FX2. The second folding axis FX2 may extend along the first direction DR1, e.g., a minor axis direction.

The display device DD may include a plurality of planar areas defined therein according to an operation mode thereof. The planar areas may include a folding area FA and at least one non-folding area. The folding area FA may be defined between two non-folding areas.

In FIGS. 3A and 3B, the folding area FA is a planar area at which the display device DD is foldable about the second folding axis FX2 to form a curvature of the display device DD. The folding area FA may be foldable about the second folding axis FX2 and may extend along the first direction DR1.

In an embodiment, the non-folding areas may include a first non-folding area NFA1 and a second non-folding area NFA2. The first non-folding area NFA1 is disposed adjacent to one side of the folding area FA along the second direction DR2, and the second non-folding area NFA2 is disposed adjacent to an opposing side of the folding area FA along the second direction DR2.

While one folding area is defined in the display device DD, the invention should not be limited thereto or thereby. In an embodiment, a plurality of folding areas may be defined in the display device DD.

Figure 4:
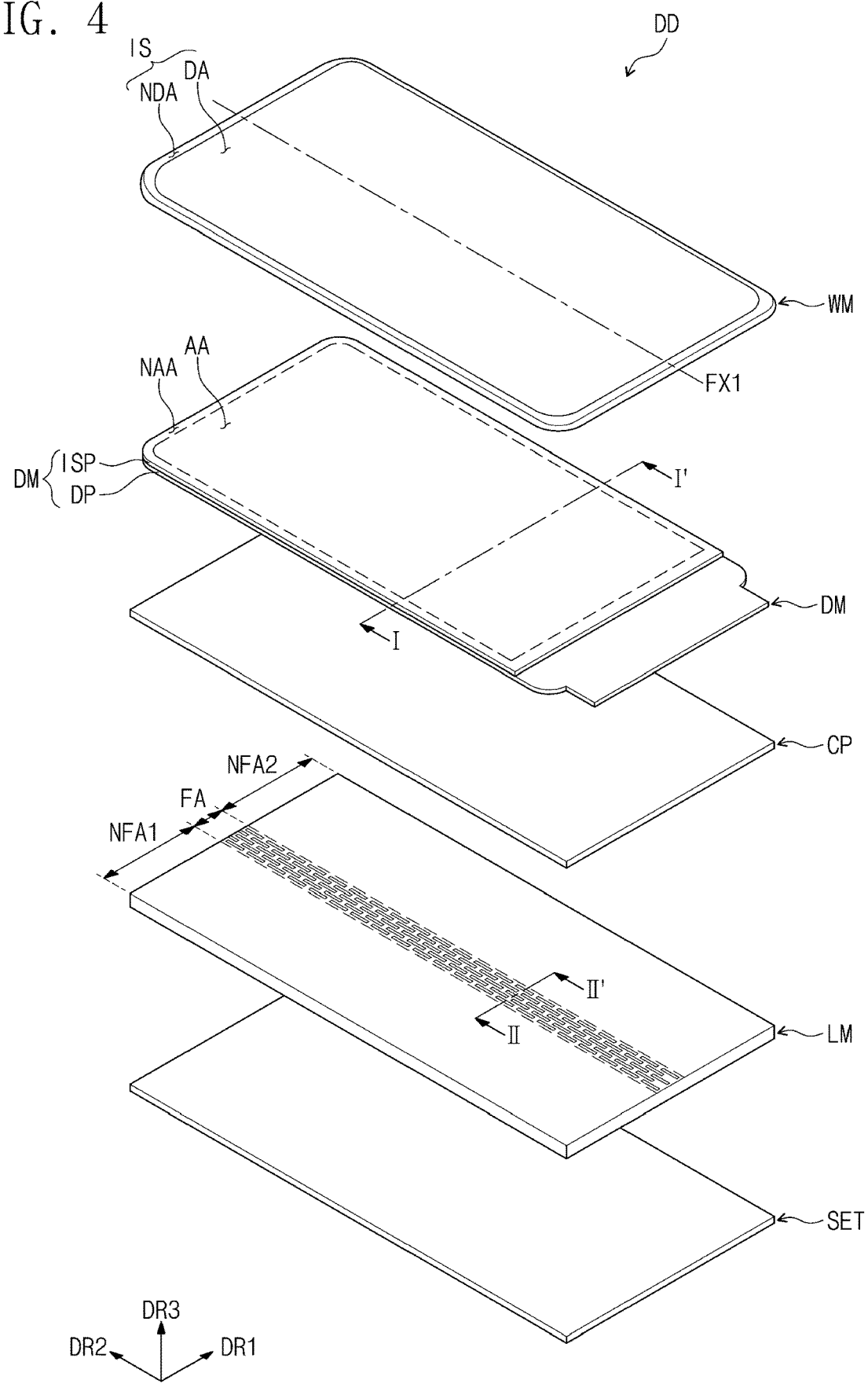
FIG. 4 is an exploded perspective view showing an embodiment of a display device.
Figure 5A:
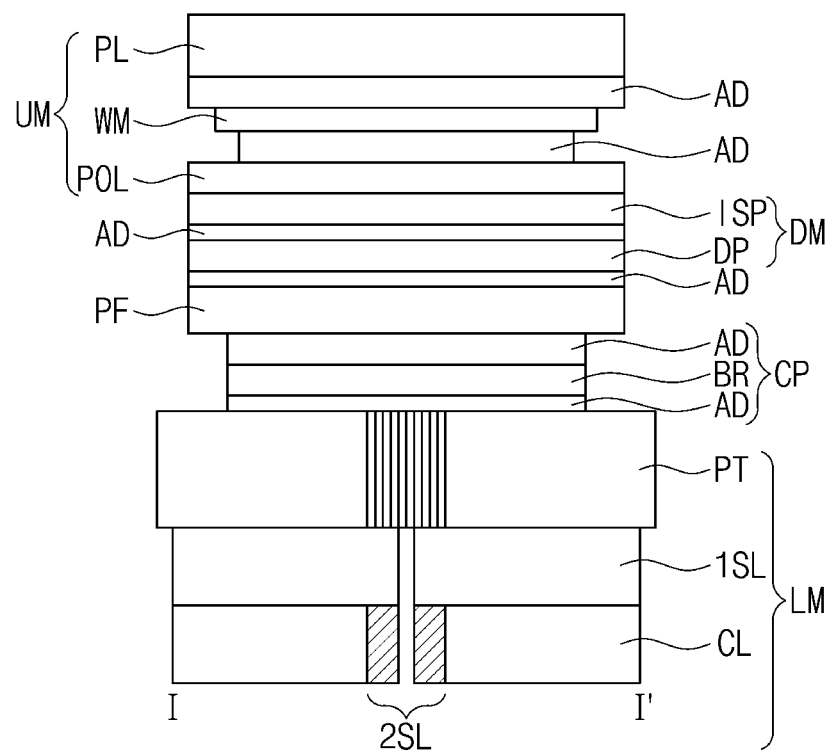
FIGS. 5A and 5B are cross-sectional views showing embodiments of a display device.
Figure 5B:
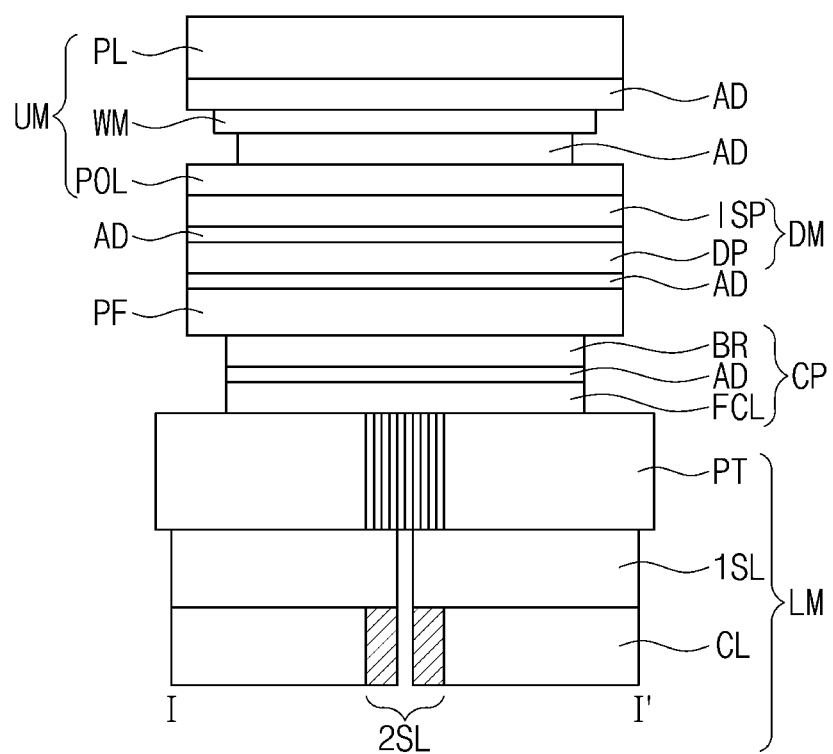

FIG. 4 is an exploded perspective view showing an embodiment of the display device DD. FIGS. 5A and 5B are cross-sectional views showing embodiments of the display device DD. FIGS. 5A and 5B are cross-sectional views taken along line I-I' of FIG. 4.

Referring to FIGS. 4 and 5A, the display device DD may include a display module DM displaying the image IM, an upper module UM disposed on the display module DM, a cover panel CP disposed under the display module DM, and a lower module LM disposed under the cover panel CP. The display module DM may be a component of the display device DD that generates the image.

In FIG. 5A, the display device DD may include an adhesive member AD provided in plural including a plurality of adhesive members AD. The adhesive members AD may include a pressure sensitive adhesive ("PSA"), an optically clear adhesive ("OCA") or an optically clear resin ("OCR"). The adhesive members AD may have different thicknesses from each other. The display module DM, the upper module UM disposed on the display module DM, the cover panel CP disposed under the display module DM, and the lower module LM disposed under the cover panel CP may be respectively attached to each other by the adhesive members AD. In an embodiment, the adhesive members AD may be omitted. Hereinafter, repeated descriptions of the adhesive members AD will be omitted in the description of each functional layer.

The display module DM may include a display panel DP and an input sensing unit ISP (e.g., input sensing layer). The display panel DP may be a light-emitting type display panel, however, should not be particularly limited. In an embodiment, for instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

The display panel DP may be a flexible display panel. Accordingly, the display panel DP may be entirely rollable, foldable and/or unfoldable about one or more folding axis. In FIG. 4, the display device DD that is foldable or unfoldable about the first folding axis FX1 will be described, however, the invention should not be limited thereto or thereby. The display device DD may be foldable or unfoldable about the second folding axis FX2 (refer to FIG. 3A).

The input sensing unit ISP may be disposed directly on the display panel DP. Elements which are described as being related directly or in contact with another may form an interface therebetween. The input sensing unit ISP which is directly on the display panel DP may be provided or formed on the display panel DP through successive processes. That is, when the input sensing unit ISP is disposed directly on the display panel DP, an adhesive film may not be disposed between the input sensing unit ISP and the display panel DP, however, should not be limited thereto or thereby. The adhesive film may be disposed between the input sensing unit ISP and the display panel DP. Where the adhesive film is disposed between the input sensing unit ISP and the display panel DP, the input sensing unit ISP is provided separate from the display panel DP, e.g., not through the successive processes. That is, the input sensing unit ISP may be coupled or fixed to an upper surface of the display panel DP by the adhesive film after being provided or manufactured through a separate process.

The display panel DP may generate the image IM, and the input sensing unit ISP may obtain coordinate information about the external input TC, e.g., a touch event.

The upper module UM may include a window WM disposed on the display module DM. The window WM may include an optically transparent insulating material. Therefore, the image IM generated by the display module DM may be perceived from outside the display device DD through the window WM.

In an embodiment, for example, the window WM may include a thin film glass or a synthetic resin film. When the window WM includes the thin film glass, the window WM may have a thickness equal to or smaller than about 80 micrometers (urn), e.g., about 30 µm. However, the thickness of the window WM should not be limited thereto or thereby.

When the window WM includes the synthetic resin film, the window WM may include a polyimide ("PI") film or a polyethylene terephthalate ("PET") film.

The window WM may have a single-layer or multi-layer structure. In an embodiment, for example, the window WM may include a plurality of synthetic resin films coupled to each other by an adhesive, or the glass substrate and the synthetic resin film coupled to the glass substrate by the adhesive. The window WM may include a flexible material. Thus, the window WM may be foldable or unfoldable about one or more folding axis. The shape of the window WM may be changed when the shape of the display module DM is changed. That is, the window WM is deformable (e.g., foldable, unfoldable, bendable, etc.) together with the display module DM. Various components or layers of the display device DD may be deformable together with each other, with the window WM and/or with the display module DM.

The image IM from the display module DM is transmittable through the window WM to outside the display device DD and substantially simultaneously buffers external impact to the display device DD to reduce or effectively prevent damage or malfunction of the display module DM due to the external impact. The external impact indicates external force, which causes defects in the display module DM, such as pressure or stress.

The upper module UM may further include a protective layer PL disposed on the window WM. The protective layer PL may improve an impact resistance of the window WM and may reduce or effectively prevent shattering of the window WM when damaged. The protective layer PL may include at least one of a urethane-based resin, an epoxy-based resin, a polyester-based resin, a polyether-based resin, an acrylate-based resin, an acrylonitrile-butadiene-styrene ("ABS") resin and a rubber.

In an embodiment, the protective layer PL may include at least one of phenylene, polyethylene terephthalate ("PET"), polyimide ("PI"), polyamide ("PA"), polyethylene naphthalate ("PEN") and polycarbonate ("PC").

In addition, the upper module UM may further include one or more of a functional layer disposed between the display module DM and the window WM. In an embodiment, the functional layer may be an anti-reflective layer POL that blocks the reflection of external light. The anti-reflective layer POL may reduce or effectively prevent perception of components included in the display module DM from outside the display device DD due to the external light incident through the front surface of the display device DD. The anti-reflective layer POL may include a retarder and a polarizer. The retarder may be a film type or liquid crystal coating type and may include a $\lambda/2$ retarder and/or a $\lambda/4$ retarder. The polarizer may be a film type or liquid crystal coating type. The film type may include a stretched type synthetic resin film, and the liquid crystal coating type may include liquid crystals aligned in a predetermined alignment. The retarder and the polarizer may be implemented as a single layer or a single polarizing film.

A protective film PF may be disposed under the display panel DP. The protective film PF may protect the rear surface of the display panel DP. The protective film PF may include a synthetic resin film. In an embodiment, the protective film PF may be a polyimide film or a polyethylene terephthalate film, however, the protective film PF should not be limited thereto or thereby.

The display module DM may display the image IM in response to one or more electrical signal and may transmit/receive information about the external input TC. The display module DM may include an active area AA and a peripheral area NAA which is adjacent to the active area AA. The active area AA may be defined as a planar area at which the image IM provided from the display module DM.

The peripheral area NAA may be defined adjacent to the active area AA. In an embodiment, for example, the peripheral area NAA may surround the active area AA. The peripheral area NAA may be defined in various planar shapes and should not be particularly limited. In an embodiment, the active area AA of the display module DM may correspond to at least a portion of the display area DA. Similarly, the peripheral area NAA of the display module DM may correspond to a portion of the non-display area NDA.

The lower module LM may be disposed under the display module DM, e.g., on a rear surface of the cover panel CP, to support the display module DM. The lower module LM may include a plate PT, at least one support layer and a cushion layer CL. Detailed descriptions of the lower module LM will be described with reference to FIGS. 6A and 6B. The lower module LM may be closer to the rear surface of the cover panel CP, while the upper module UM is closer to the front surface of the cover panel CP.

The display device DD may include the cover panel CP disposed between the display module DM and the lower module LM. That is, the display module DM may face the lower module LM with the cover panel CP therebetween. The cover panel CP may be disposed under the display module DM to support the rear surface of the display module DM and to protect the display module DM. The cover panel CP may include a barrier BR having elasticity that is advantageous to restore deformation of the display module DM while protecting the display module DM, and a cushion that supports the display module DM and has impact resistance.

The barrier BR may be disposed between the display module DM and the cushion. The barrier BR may include adhesive layers respectively disposed on upper and lower surfaces thereof. One or more of the adhesive layers may be omitted. In an embodiment, the barrier BR including an elastic material may be disposed under the display module DM. The barrier BR provides reduction in a degree in flexural deformation of the display device DD and restores the display device DD and various components or layers thereof to original forms or shape even though the display device DD is repeatedly deformed (e.g., repeatedly folded and unfolded). The barrier BR may define a shape-restoring layer of the display device DD.

The barrier BR may include a highly elastic material. The barrier BR including the highly elastic material may have a yield strain equal to or greater than about 1.0% and equal to or smaller than about 2.5%. The barrier BR may have a wide elastic limit, and thus, the barrier BR may be advantageous in restoring a component or layer to an original shape or form from the deformation caused by external force.

The barrier BR may include a material with high rigidity. That is, the barrier BR may include a material that is highly resistant to deformation. The barrier BR may have a modulus equal to or greater than about 2 gigapascals (GPa) and equal to or smaller than about 200 GPa at a room temperature. The barrier BR may include a polymer material, a glass material or a metal material, which has a relatively high rigidity. In an embodiment, for example, the barrier BR may include polyimide, polycarbonate or polyethylene terephthalate or may include an Ultra-Thin Glass ("UTG"), a glass fiber, a stainless steel ("SUS") or a nano stainless steel.

According to an embodiment, the cover panel CP may not include the cushion. Referring to FIGS. 5A and 5B, a cushion layer CL is in the lower module LM instead of a cushion being in the cover panel CP. The cushion of the cover panel CP and the cushion layer CL of the lower module LM may include a same material as each other. As the cushion layer CL is disposed in the lower module LM instead of the cover panel CP, the impact resistance of the display device DD may be improved.

In FIG. 5B, the cover panel CP may further include a foam coating layer FCL (e.g., foam layer) disposed under the barrier BR. The foam coating layer FCL may be a material layer which is coated directly on the plate PT of the lower module LM such as by using a slit coating method, a screen-printing coating method, or the like. Accordingly, an adhesive member AD to attach the plate PT and the foam coating layer FCL to each other is not provided. Properties, e.g., elasticity, impact resistance, etc., of the foam coating layer FCL disposed directly on the plate PT may be controlled by adjusting a type or content of a foaming agent. Accordingly, the foam coating layer FCL may have a predetermined elasticity and may absorb the impact applied thereto.

Referring to FIG. 4, the display device DD may include a set member SET that covers the lower module LM. The set member SET may correspond to a housing of the display device DD. The set member SET and the window WM may form an outer surface of the display device DD without being limited thereto. The set member SET may include a hinge portion overlapping the folding area FA of the display device DD and a housing portion overlapping both the folding area FA and the non-display area. In an embodiment, the shape of the set member SET should not be limited to that shown in FIG. 4. The set member SET may have a variety of shapes to cover the window WM, the display module DM and the lower module LM.

Figure 6A:
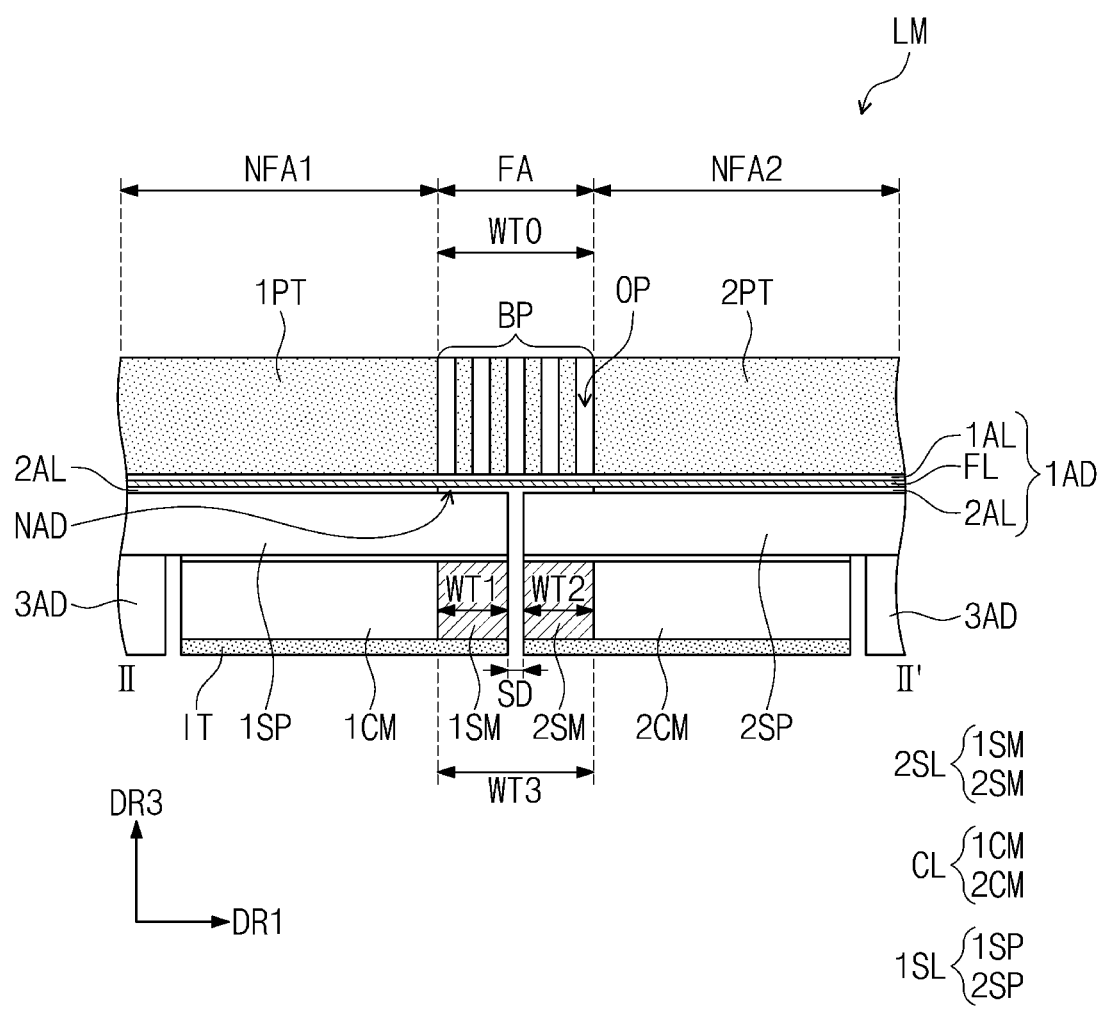
FIGS. 6A and 6B are cross-sectional views showing embodiments of a lower module.
Figure 6B:
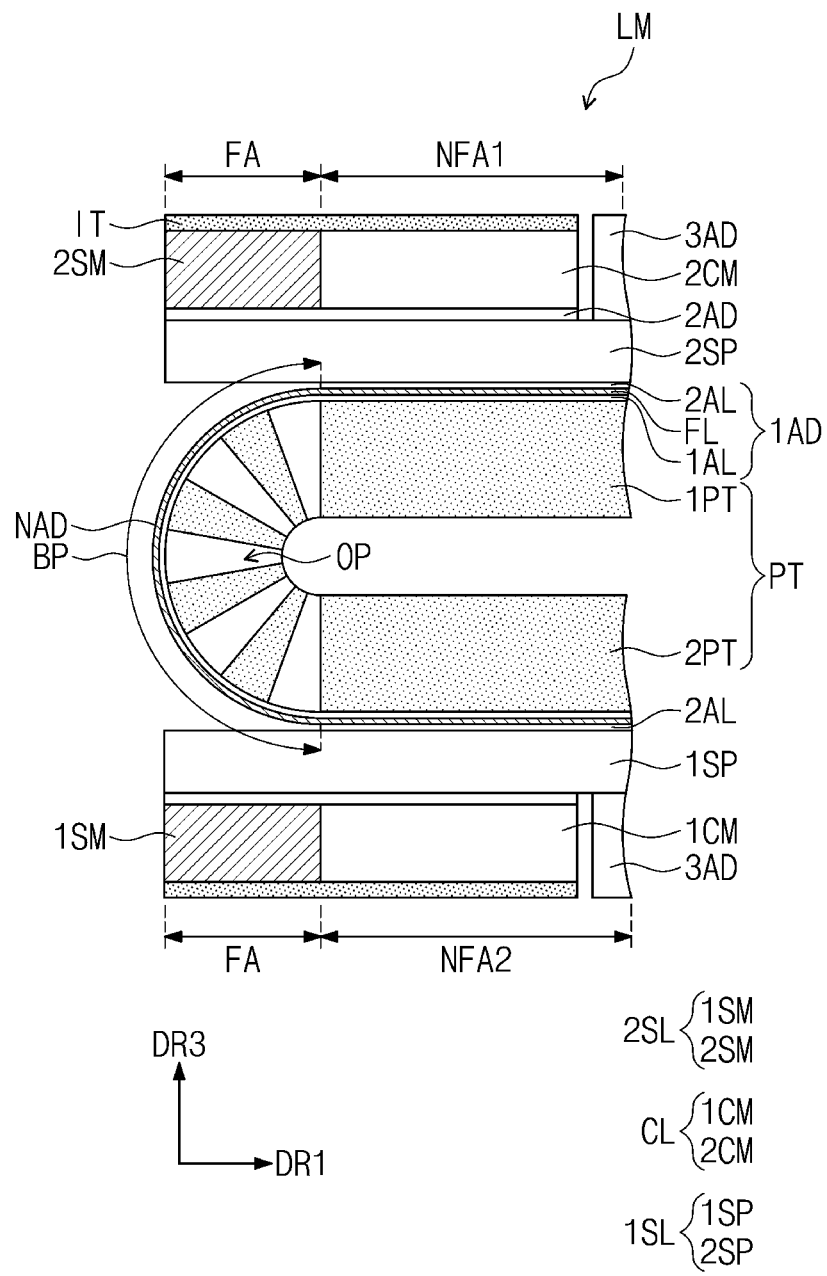

FIGS. 6A and 6B are cross-sectional views showing embodiments of the lower module LM. FIGS. 6A and 6B are cross-sectional views taken along line II-IF of FIG. 4. FIG. 6A shows the lower module LM of the display device DD which is not folded, and FIG. 6B shows the lower module LM of the display device DD which is folded.

Referring to FIGS. 6A and 6B, the lower module LM may include the plate PT, a first support layer 1SL (e.g., support plate), a second support layer 2SL and the cushion layer CL.

The plate PT may be disposed on the rear surface of the display module DM (refer to FIG. 5A) and may support the display module DM. The plate PT may have a plate shape. In an embodiment, the plate PT may have a planar size corresponding to the display module DM. In addition, the plate PT may include a metal material. That is, the plate PT may be a metal plate. In an embodiment, the plate PT may include stainless steel, aluminum or alloys thereof. The plate PT may have a mechanical strength greater than a mechanical strength of the display module DM. The plate PT may have a thickness of about 150 μm, however, the thickness of the plate PT should not be limited thereto or thereby.

The plate PT may include a bending portion BP in which a grid pattern OP provided in plural including a plurality of grid patterns OP is defined, a first plate portion 1PT extending from the bending portion BP, and a second plate portion 2PT extending from the bending portion BP. The grid patterns OP may be arranged in the bending portion BP to be spaced apart from each other at predetermined intervals. In a plan view, the grid patterns OP may be arranged in a zigzag shape.

In addition, each of the grid patterns OP may be an opening defined through the plate PT. That is, the grid pattern OP may extend through a thickness of the plate PT at the bending portion BP. However, the invention should not be limited thereto or thereby. In an embodiment, each of the grid patterns OP may be a groove pattern recessed from one surface (e.g., an upper or lower surface) of the plate PT. In a plan view, each of the grid patterns OP may have a quadrangular shape extending along the second direction DR2 (refer to FIG. 4) along the folding area FA. Referring to FIG. 4, for example, the grid pattern OP may have a major dimension which is extended along the second direction DR2. However, the shape of the grid patterns OP should not be limited thereto or thereby. In an embodiment, for example, each of the grid patterns OP may have a lozenge shape (e.g., rhombus or diamond shape) or a circular shape in the plan view.

The grid patterns OP defined in the bending portion BP of the plate PT may increase flexibility of the plate PT at the bending portion BP. The bending portion BP may overlap or correspond to the folding area FA. The plate PT may support the display module DM and also may allow the display device DD (refer to FIG. 5A) to be easily folded as the plate PT includes the bending portion BP. That is, the display module DM is bendable or foldable together with the plate PT.

The first plate portion 1PT and the second plate portion 2PT may have a single plate shape that extends in different/opposite directions from the bending portion BP along the first direction DR1. The display device DD which is unfolded or flat disposes the first plate portion 1PT, the bending portion BP and the second plate portion 2PT coplanar with each other and in order along the first direction DR1.

The first support layer 1SL may be disposed under the plate PT and may support the display module DM together with the plate PT. The first support layer 1SL may include support plates, and the number of the support plates may correspond to the number of the non-folding areas. Referring to FIGS. 6A and 6B, the first support layer 1SL may include a first support plate 1SP and a second support plate 2SP. The first support plate 1SP may overlap or correspond to the first non-folding area NFA1, and the second support plate 2SP may overlap or correspond to the second non-folding area NFA2. That is, the first and second support plates 1SP and 2SP may be disposed to correspond to the first and second non-folding areas NFA1 and NFA2, respectively. The first support plate 1SP may be disposed to correspond to the first non-folding area NFA1 of the display module DM, and the second support plate 2SP may be disposed to correspond to the second non-folding area NFA2 of the display module DM. The first support plate 1SP may be disposed to overlap or correspond to the first plate portion 1PT, and the second support plate 2SP may be disposed to overlap or correspond to the second plate portion 2PT. The first support layer 1SL may have a thickness of about 80 μm, however, the thickness of the first support layer 1SL should not be limited thereto or thereby.

Each of the first support plate 1SP and the second support plate 2SP may include a metal material. That is, each of the first support plate 1SP and the second support plate 2SP may be a metal plate. In an embodiment, each of the first support plate 1SP and the second support plate 2SP may include substantially the same material as that of the plate PT. In addition, each of the first support plate 1SP and the second support plate 2SP may have a thickness equal to or smaller than that of the plate PT.

When the display module DM is unfolded or flat, the first and second support plates 1SP and 2SP may be arranged to be spaced apart from each other along the first direction DR1 (FIG. 6A). That is, the first and second support plates 1SP and 2SP are disconnected from each other at the folding area FA. The display module DM which is folded or bent about the folding axis FX1, the first and second support plates 1SP and 2SP may be arranged to be spaced apart from each other along the third direction DR3 (FIG. 6B).

The first and second support plates 1SP and 2SP may be spaced apart from or disconnected from each other in the folding area FA. A portion of each of the first and second support plates 1SP and 2SP may be disposed in the folding area FA. Remaining portions of the first and second support plates 1SP and 2SP may be disposed in the first non-folding area NFA1 and the second non-folding area NFA2, respectively. The display device DD which is unfolded or flat includes a separation distance SD along the first direction DR1 between the first and second support plates 1SP and 2SP which may be smaller than a width WT0 of the folding area FA.

The first support layer 1SL includes two support plates, however, the invention should not be limited thereto or thereby. That is, when the folding axis is provided in plural, the first support layer 1SL may include a plurality of support plates that are separated from each other with respect to the folding axes.

The cushion layer CL may be disposed under the first support layer 1SL (e.g., support plate). The cushion layer CL may include a sponge, a foam or a urethane resin, which has compressibility. In an embodiment, for example, the cushion layer CL may have a compression ratio of about 70%. A second adhesive member 2AD may be disposed between the cushion layer CL and the first support layer 1SL.

The cushion layer CL may include a first cushion member 1CM and a second cushion member 2CM. The first cushion member 1CM may be disposed under the first support plate 1SP, and the second cushion member 2CM may be disposed under the second support plate 2SP. In an embodiment, each of the first cushion member 1CM and the second cushion member 2CM may have a thickness of about 100 μm. The cushion layer CL may reduce or effectively prevent compression of and plastic deformation of the plate PT and the first and second support plates 1SP and 2SP due to external impact and force. That is, the cushion layer CL may improve the impact resistance of the display device DD.

In particular, when the cushion layer CL is disposed under the first and second support plates 1SP and 2SP, the impact resistance of the display device DD may be improved when compared with that of a structure in which the cushion layer CL is disposed on the plate PT (e.g., between the plate PT and the display module DM). The impact resistance may be checked through a point impact test or a surface impact test. A point impact corresponds to an impact applied to the display device DD when a pointed device such as a pen falls from an arbitrary height. A surface impact indicates an impact caused by a device such as a ball, and the surface impact test measures how much impact load the display device DD has absorbed when the ball having a predetermined size and weight is dropped.

In a comparative example, the point impact test was performed under the same condition on a first structure in which the cushion layer CL is disposed on the plate PT (e.g., between the plate PT and the display module DM) and a second structure in which the cushion layer CL is disposed under the first support layer 1SL, and the results show that the first structure absorbs the impact caused by falling the pointed device at a height of up to about 2 centimeters (cm), and the second structure absorbs the impact caused by falling the pointed device at a height of up to about 7 cm at the non-folding area. That is, when the cushion layer CL is disposed under the first support layer 1SL, the impact resistance may be improved. In the folding area FA, the first structure absorbs the impact caused by falling of the pointed device at a height of up to about 1 cm, and the second structure absorbs the impact caused by falling of the pointed device at a height of up to about 3 cm. That is, the impact resistance in the folding area FA does not increase as effectively as in the non-folding areas with only the first and second cushion members 1CM and 2CM since the bending portion BP is sagging due to the grid patterns OP. According to an embodiment including the cushion layer CL disposed under the first support layer 1SL, sagging of the bending portion BP of the plate PT, which overlaps the folding area FA, may be reduced or effectively prevented and the impact resistance of the display device DD may increase.

The second support layer 2SL may overlap or correspond to the folding area FA. The second support layer 2SL may be disposed under the first support layer 1SL and may support the folding area FA of the display module DM. The second support layer 2SL may support the bending portion BP of the plate PT. The second support layer 2SL may include a first support member 1SM which supports the first support plate 1SP and a second support member 2SM which supports the second support plate 2SP at the folding area FA. Referring to FIG. 6A, the first support member 1SM and the second support member 2SM may be spaced apart from each other along the first direction DR1 by the separation distance SD between the first support plate 1SP and the second support plate 2SP. That is, the first support member 1SM and the second support member 2SM may be disconnected from each other at the folding area FA.

The first support member 1SM and the second support member 2SM may support the bending portion BP of the plate PT to reduce the sagging phenomenon of the plate PT at the bending portion BP.

The second support layer 2SL may be disposed on the same layer as the cushion layer CL. As being on a same layer, elements may be disposed in a same layer of the display device DD. The first cushion member 1CM, the first support member 1SM, the second support member 2SM and the second cushion member 2CM may be coplanar with each other and in order along the first direction DR1. The second support layer 2SL and the cushion layer CL may be disposed in the same layer which is under the first support layer 1SL, the second support layer 2SL may support the display module DM at the folding area FA, and the cushion layer CL may support the display module DM at the non-folding areas.

The first support member 1SM and the second support member 2SM may include a material with a mechanical strength greater than a mechanical strength of the first cushion member 1CM and the second cushion member 2CM to reduce or effectively prevent the sagging of the plate PT at the bending portion BP.

In more detail, the first support member 1SM may have a modulus greater than a modulus of the first cushion member 1CM, and the second support member 2SM may have a modulus greater than a modulus of the second cushion member 2CM. The modulus may mean a Young's modulus. The Young's modulus is a mechanical property that measures strength of a solid material.

In an embodiment, for example, each of the first cushion member 1CM and the second cushion member 2CM may have the modulus from about 50 GPa to about 100 GPa, and each of the first support member 1SM and the second support member 2SM may have the modulus of about 1 gigapascal (GPa). The first support member 1SM and the second support member 2SM may include or be formed of various materials having the modulus of about 1 GPa. In an embodiment, the first support member 1SM and the second support member 2SM may include polyethylene terephthalate ("PET"), polyimide ("PI") or polycarbonate ("PC").

The second support layer 2SL may have a thickness that is the same as a thickness of the cushion layer CL. The thickness may mean a distance along the third direction DR3. The thickness may mean a maximum distance along the third direction DR3, without being limited thereto. Since the first and second cushion members 1CM and 2CM of the cushion layer CL have compressibility, the thickness of the cushion layer CL may be greater than the thickness of the second support layer 2SL.

In an embodiment, the thickness of the second support layer 2SL may be greater than the thickness of the first support layer 1SL and may be smaller than the thickness of the plate PT.

The second support layer 2SL may be disposed in the folding area FA. A sum of a first width WT1 of the first support member 1SM and a second width WT2 of the second support member 2SM may be equal to or smaller than the width WT0 of the folding area FA or the width WT0 of the bending portion BP. In this case, the width may mean a length or distance along the display module DM, such as along the first direction DR1.

The lower module LM may further include a first adhesive member 1AD disposed between the plate PT and the first support layer 1SL, and the second adhesive member 2AD disposed between the first support layer 1SL and the cushion layer CL and between the first support layer 1SL and the second support layer 2SL.

The first adhesive member 1AD may attach the first support layer 1SL to the lower surface of the plate PT. The thickness of the first adhesive member 1AD may be in a range from about 10 μm to about 25 μm.

The first adhesive member 1AD may include a first adhesive layer 1AL, a second adhesive layer 2AL facing the first adhesive layer 1AL, and an auxiliary member FL disposed between the first adhesive layer 1AL and the second adhesive layer 2AL.

The first adhesive layer 1AL may be in contact with the plate PT. The second adhesive layer 2AL may include a plurality of adhesive patterns that are respectively in contact with the first and second support plates 1SP and 2SP. The adhesive members may be disposed to be spaced apart from each other, such as to be disconnected from each other at the folding area FA. The second adhesive layer 2AL may include a non-adhesive portion NAD at which the second adhesive layer 2AL is unattachable or removably attachable to the first support layer 1SL. The non-adhesive portion NAD may overlap or correspond to the folding area FA. The non-adhesive portion NAD may correspond to an open area or gap defined between the adhesive members of the second adhesive layer 2AL which are spaced apart from each other. Therefore, the non-adhesive portion NAD may correspond to portions of the second adhesive layer 2AL which are not in contact with the first and second support plates 1SP and 2SP.

In an embodiment, a fourth width of the non-adhesive portion NAD may be substantially the same as the width WT0 of the bending portion BP. Referring to FIG. 6B, the non-adhesive portion NAD of the second adhesive layer 2AL may correspond to a portion of the display device DD that is bent at the bending portion BP when the lower module LM is folded. The first and second support plates 1SP and 2SP may be farther away from the non-adhesive portion NAD when the lower module LM is folded.

The auxiliary member FL may be disposed between the first adhesive layer 1AL and the second adhesive layer 2AL. The auxiliary member FL may correspond to a plastic with high durability and flexibility. In an embodiment, for example, the auxiliary member FL may include a thermoplastic polyurethane ("TPU").

In an embodiment, each of the first adhesive layer 1AL, the second adhesive layer 2AL and the auxiliary member FL may have a thickness from about 5 μm to about 10 μm, such as about 8 μm.

The second adhesive member 2AD may attach the second support layer 2SL and the cushion layer CL to the lower surface of the first support layer 1SL. The second adhesive member 2AD may have a thickness from about 5 μm to about 10 μm. In an embodiment, the lower module LM may not include (e.g., may exclude) the second adhesive member 2AD.

The lower module LM may further include a third adhesive member 3AD. The third adhesive member 3AD may be disposed under the first support layer 1SL. The third adhesive member 3AD may be disposed not to overlap the second support layer 2SL and the cushion layer CL along the third direction DR3. That is, the third adhesive member 3AD, the second support layer 2SL and the cushion layer CL may be coplanar with each other. Accordingly, the third adhesive member 3AD may compensate for a step difference along the first support layer 1SL between an area in which the second support layer 2SL and the cushion layer CL are disposed and an area in which the second support layer 2SL and the cushion layer CL are not disposed. The third adhesive member 3AD may have a thickness greater than the thickness of the second support layer 2SL. In an embodiment, for example, the thickness of the third adhesive member 3AD may be substantially the same as a sum of the thickness of the second support layer 2SL and a thickness of an insulating member IT.

The third adhesive member 3AD may include a first portion disposed adjacent to the first support plate 1SP and a second portion disposed adjacent to the second support plate 2SP. The first portion and the second portion may be disconnected from each other and spaced apart from each other along the first support layer 1SL. The third adhesive member 3AD may be spaced apart from the folding area FA in a direction along the first support layer 1SL. The third adhesive member 3AD may be disposed farther away from the folding area FA than the cushion layer CL. In an embodiment, the third adhesive member 3AD extends further from the first support plate 1SP and the second support plate 2SP than the cushion layer CL.

The first adhesive member 1AD, the second adhesive member 2AD and the third adhesive member 3AD may include an adhesive material. Each of the first adhesive member 1AD, the second adhesive member 2AD and the third adhesive member 3AD may include an acrylic-based resin or a silicon-based resin. In an embodiment, for example, each of the first adhesive layer 1AL, the second adhesive layer 2AL, the second adhesive member 2AD and the third adhesive member 3AD may include a pressure sensitive adhesive ("PSA"), an optical clear adhesive ("OCA") or an optical clear resin ("OCR").

The lower module LM may include the insulating member IT disposed under the cushion layer CL and the second support layer 2SL. The insulating member IT may be provided in the form of film or tape. The insulating member IT may reduce or effectively prevent occurrence of rattle in the display device DD. The insulating member IT may have a thickness of about 15 μm, however, should not be limited thereto or thereby. The insulating member IT may be disconnected at the folding area FA at an area corresponding to the separation distance SD.

FIG. 6B shows the lower module LM of FIG. 6A which is folded about the folding axis FX1 (refer to FIG. 1). That is, the bending portion BP of the plate PT at the folding area FA may be bent, and thus, the lower module LM may be folded together with the display module DM. Since the bending portion BP includes the grid patterns OP, the bending portion BP may be easily bent. In the display device DD which is folded, the first plate portion 1PT and the second plate portion 2PT of the plate PT may face each other along the third direction DR3. In the folding area FA, the first support member 1SM and the second support member 2SM may be spaced apart from each other and may overlap each other along the third direction DR3.

FIG. 7 is a cross-sectional view showing an embodiment of a lower module LM. In FIG. 7, the same descriptions as those of FIGS. 6A and 6B will be omitted.

A second support layer 2SL may support a bending portion BP of a plate PT by only a first adhesive member 1AD between the second support layer 2SL and the plate PT. That is, a first support member 1SM and a second support member 2SM may more directly support a lower surface of the plate PT at the bending portion BP as shown in FIG. 7 since only the first adhesive member 1AD is between the second support layer 2SL and the plate PT and the first support layer 1SL is excluded from between the second support layer 2SL and the plate PT. In an embodiment, the first support member 1SM and the second support member 2SM may directly support a lower surface of the plate PT at the bending portion BP by further excluding the first adhesive member 1AD therebetween.

Referring to FIG. 7, a portion of a second adhesive member 2AD may be omitted from between the first support layer 1SL and the cushion layer CL. The first adhesive member 1AD and the second adhesive member 2AD may be provided in the form of thin film. The second support layer 2SL may have a thickness that is substantially the same as a sum of a thickness of the first support layer 1SL and a thickness of the cushion layer CL.

The second support layer 2SL may be coplanar with each of the cushion layer CL, the second adhesive member 2AD and the first support layer 1SL. The second support layer 2SL may be closer to the display module DM than the second adhesive member 2AD and the cushion layer CL. A gap is defined between disconnected portion of respective layers among the cushion layer CL, the second adhesive member 2AD and the first support layer 1SL. Inner sidewalls of the cushion layer CL, the second adhesive member 2AD and the first support layer 1SL are defined at the gap. The second support layer 2SL is disposed in the gap and extends along the inner sidewalls of the cushion layer CL, the second adhesive member 2AD and the first support layer 1SL.

The first support member 1SM and the second support member 2SM may be attached to an insulating member IT-1. The insulating member IT-1 may include or be formed of a material with high mechanical strength. In an embodiment, the insulating member IT-1 may include or be formed of a material having a modulus of about 1 GPa. In an embodiment, for example, the insulating member IT-1 may include substantially the same material as that of the first support member 1SM and the second support member 2SM. That is, the insulating member IT-1 may include polyethylene terephthalate ("PET"), polyimide ("PI") or polycarbonate (PC). The insulating member IT-1 may be attached to a lower surface of the cushion layer CL and a lower surface of the second support layer 2SL.

In FIG. 7, a third width WT3 of the second support layer 2SL is substantially the same as a width WT0 of the bending portion BP, however, should not be limited thereto or thereby. That is, the third width WT3 of the second support layer 2SL may be greater than or smaller than the width WT0 of the bending portion BP. The second support layer 2SL is disposed in the folding area FA, however, should not be limited thereto or thereby.

In an embodiment, the second support layer 2SL may partially overlap first and second non-folding areas NFA1 and NFA2. The third width WT3 of the second support layer 2SL may correspond to a total width or total length obtained by summing a width of the first support member 1SM, a width of the second support member 2SM and a separation distance SD between the first support member 1SM and the second support member 2SM along the first direction DR1.

Figure 8:
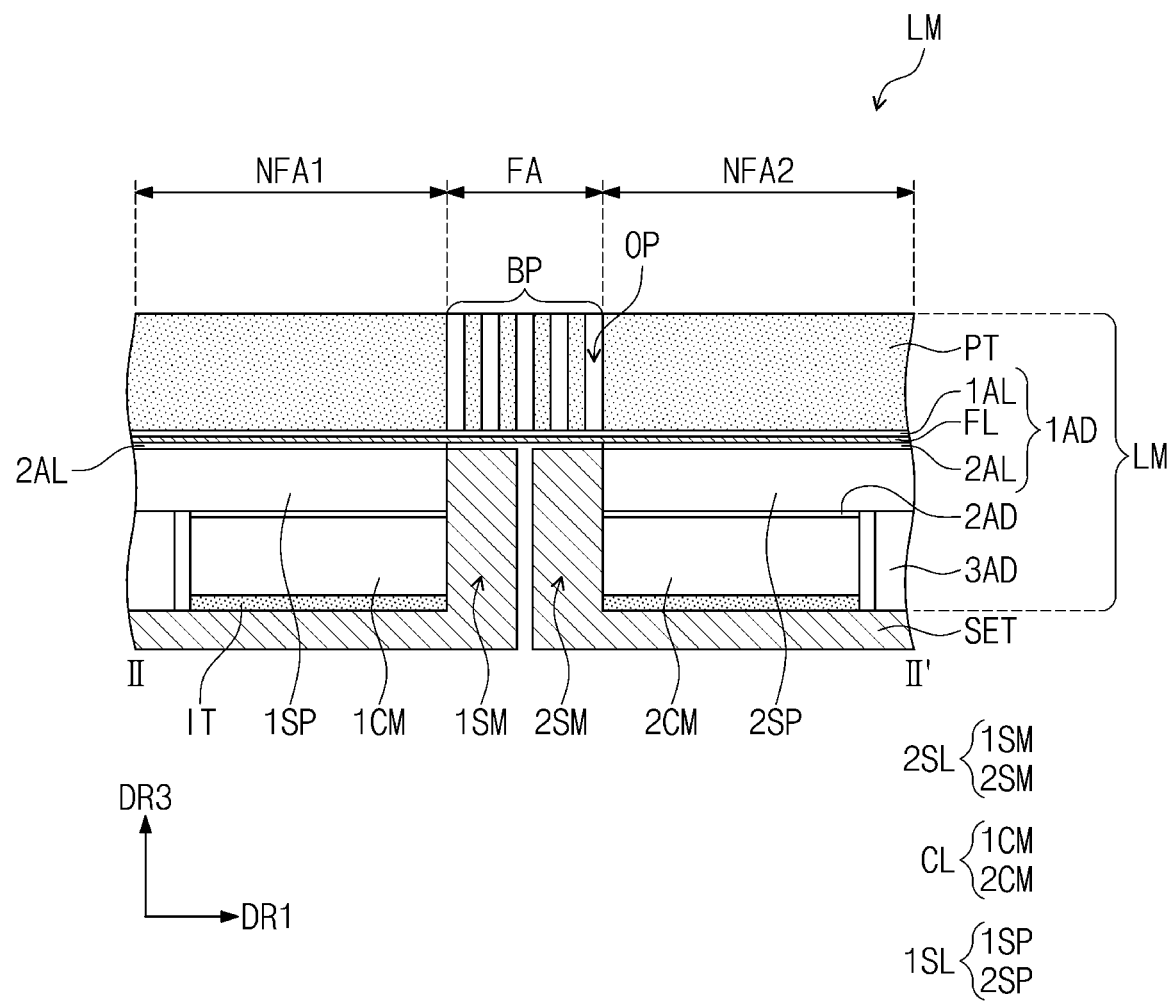
FIG. 8 is a cross-sectional view showing an embodiment of a display device.
Figure 9:
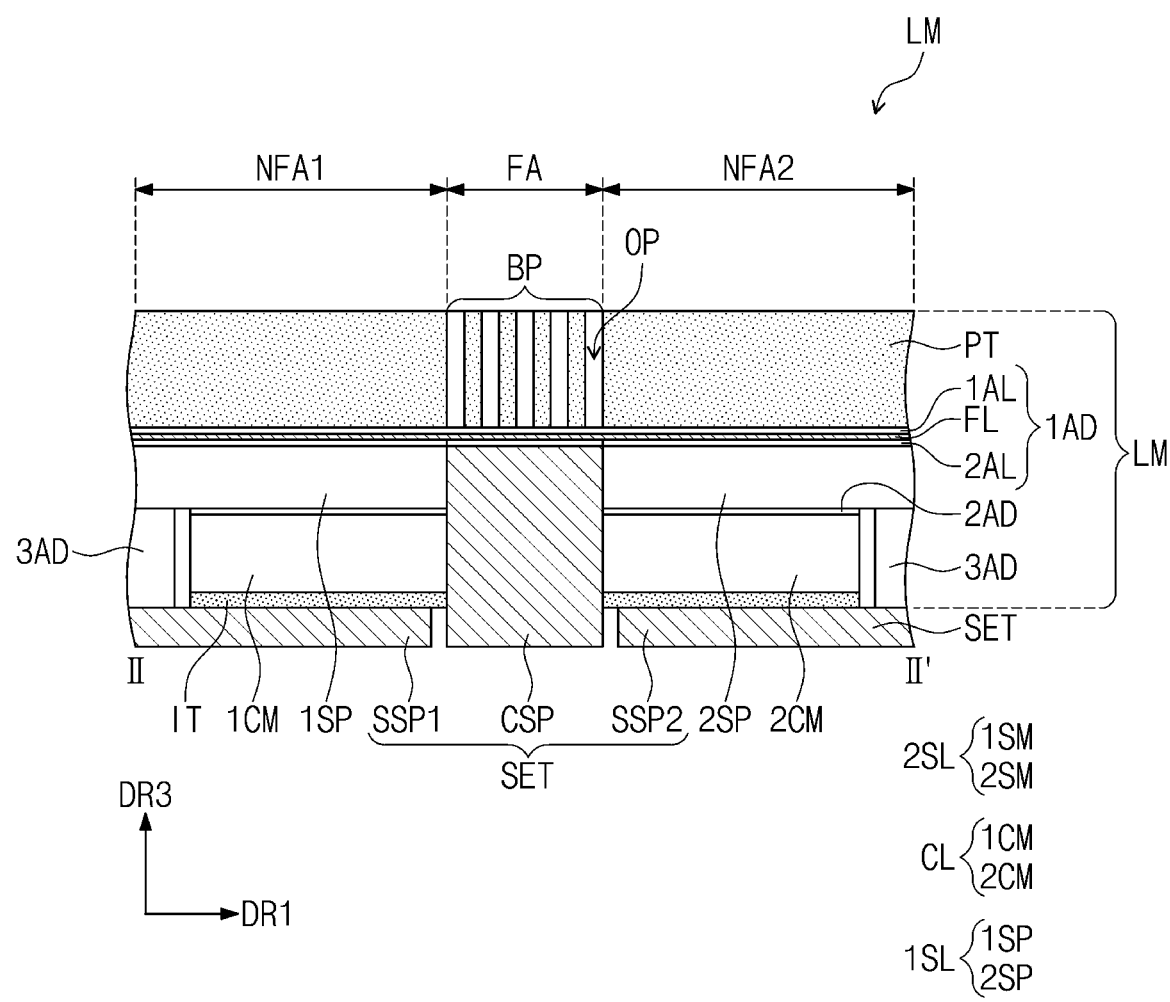
FIG. 9 is a cross-sectional view showing an embodiment of a display device.

FIG. 8 is a cross-sectional view showing an embodiment of a lower module LM. FIG. 9 is a cross-sectional view showing an embodiment of a lower module LM.

Referring to FIGS. 8 and 9, a display device DD (refer to FIG. 5) may include a set member SET disposed under a lower module LM. The set member SET may be a housing that protects the display device DD including the lower module LM from external contact. The set member SET may support the lower module LM.

In FIG. 8, a first support member 1SM and a second support member 2SM may extend from the set member SET. As discussed above, the second support layer 2SL is disposed in the gap defined between disconnected portion of respective layers among the cushion layer CL, the second adhesive member 2AD and the first support layer 1SL. The second support layer 2SL extends along the inner sidewalls of the cushion layer CL, the second adhesive member 2AD and the first support layer 1SL. In an embodiment, the second support layer 2SL extends outside of the gap and along the insulating member IT to define the set member SET. Similar to the discussion for FIG. 7, the first support member 1SM and the second support member 2SM may more directly support a bending portion BP of a plate PT since only the first adhesive member 1AD is between the second support layer 2SL and the plate PT and the first support layer 1SL is excluded from between the second support layer 2SL and the plate PT. In an embodiment, the first support member 1SM and the second support member 2SM may directly support a lower surface of the plate PT at the bending portion BP by further excluding the first adhesive member 1AD therebetween.

In FIG. 9, the set member SET may include a center support portion CSP, a first side support portion S1SP at a first side of the center support portion CSP, and a second side support portion S2SP at a second side of the center support portion CSP which is opposite to the first side thereof. The center support portion CSP may overlap or correspond to the folding area FA. In an embodiment, the center support portion CSP may be solid along the first direction DR1 so as to define a single pattern of the second support layer 2SL. The first side support portion S1SP and the second side support portion S2SP may correspond to a portion of a housing that covers the display device DD. That is the first side support portion 51SP and the second side support portion S2SP may be furthest from the display module DM to define an outer surface of the display device DD.

Similar to the discussion above for FIG. 7, the center support portion CSP may more directly support a bending portion BP of the plate PT since only the first adhesive member 1AD is between the center support portion CSP and the plate PT and the first support layer 1SL is excluded from between the center support portion CSP and the plate PT. In an embodiment, the center support portion CSP may directly support a lower surface of the plate PT at the bending portion BP by further excluding the first adhesive member 1AD therebetween.

The center support portion CSP may include a hinge. In an embodiment, folding of the display device DD increases a distance of, the hinge of the center support portion CSP from the lower module LM. Unfolding of the display device DD may decrease a distance of the hinge of the center support portion CSP to the lower module LM such that the hinge may directly support the lower surface of the bending portion BP of the plate PT in place of the cushion layer CL and the first support layer 1SL. That is, the center support portion CSP may serve the role of the second support layer 2SL of FIG. 7.

Figure 10:
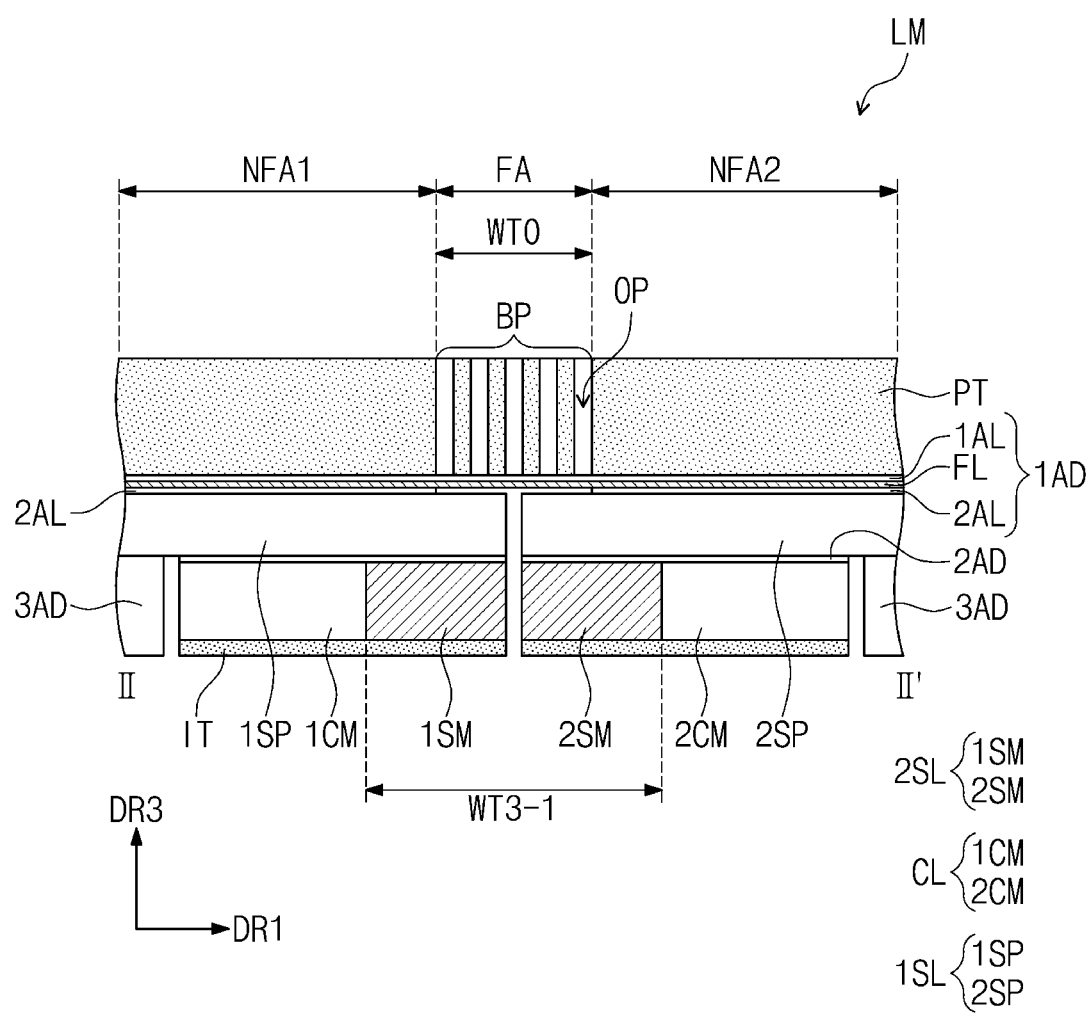
FIG. 10 is a cross-sectional view showing an embodiment of a display device.

FIG. 10 is a cross-sectional view showing an embodiment of a display device DD. A third width WT3-1 of the second support layer 2SL may be greater than a width WT0 of a bending portion BP. The second support layer 2SL may have the third width WT3-1 greater than the width WT0 of the folding area FA to support the folding area FA of the display module DM which is flat. A first support member 1SM may overlap a portion of the folding area FA and a portion of a first non-folding area NFA1 which is adjacent to the folding area FA, and a second support member 2SM may overlap a portion of the folding area FA and a portion of the second non-folding area NFA2 which is adjacent to the folding area FA.

Although embodiments of the invention have been described, it is understood that the invention should not be limited to these embodiments but various changes and modifications can be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:

1. A display device comprising:
   a display module comprising a folding area at which the display module is foldable;
   a plate facing the display module, the plate comprising:
      a bending portion corresponding to the folding area, and
      a plurality of openings defined in the bending portion,
      a first plate portion and a second plate portion extending from opposing sides of the bending portion in a direction away from the bending portion;
   a support layer facing the display module with the plate therebetween, the support layer comprising a first support member and a second support member corresponding to the bending portion and spaced apart from each other at the bending portion; and
   a cushion layer facing the display module with the plate therebetween, the cushion layer comprising:
      a first cushion member corresponding to the first plate portion of the plate, and
      a second cushion member corresponding to the second plate portion of the plate,
   wherein
   each of the first support member, the second support member, the first cushion member and the second cushion member has a modulus, and
   each of the modulus of the first support member and the modulus of the second support member is greater than the modulus of the first cushion member and the modulus of the second cushion member.

2. The display device of claim 1, further comprising:
   a first support plate between the first plate portion of the plate and the first cushion member of the cushion layer; and a second support plate between the second plate portion of the plate and the second cushion member of the cushion layer.

3. The display device of claim 1, wherein
each of the first support member and the second support member has a modulus, and
the modulus of each of the first support member and the second support member is equal to or greater than about 1 gigapascal.

4. The display device of claim 1, wherein the first support member and the second support member comprise polyethylene terephthalate, polyimide or polycarbonate.

5. The display device of claim 1, wherein
the first support member and the second support member are spaced apart from each other along a first direction,
each of the first support member, the second support member and the bending portion has a width along the first direction, and
a sum of the width of the first support member and the width of the second support member is smaller than the width of the bending portion.

6. The display device of claim 1, wherein
the first support member and the second support member are spaced apart from each other along a first direction, and
the plurality of openings are spaced apart from each other along the first direction.

7. The display device of claim 2, further comprising a first adhesive member which is between the plate and the first and second support plates, wherein
the first adhesive member comprises a first adhesive layer, an auxiliary member and a second adhesive layer in order from the plate to the first and second support plates,
the first adhesive layer is in contact with each of the first plate portion, the bending portion and the second plate portion of the plate, and
the second adhesive layer comprise a plurality of adhesive patterns spaced apart from each other at the bending portion and respectively in contact with the first support plate and the second support plate and an auxiliary member disposed between the first and second adhesive layers.

8. The display device of claim 7, wherein
the plurality of adhesive patterns are spaced apart from each other along a first direction by a gap in the bending portion which defines a non-adhesive portion of the second adhesive layer,
each of the non-adhesive portion of the second adhesive layer and the bending portion of the plate has a width along the first direction, and
the width of the non-adhesive portion is equal to the width of the bending portion.

9. The display device of claim 2, wherein
the support layer corresponds to the bending portion and faces the bending portion of the plate with the first and second support plates therebetween, and
the cushion layer and the support layer are coplanar with each other.

10. The display device of claim 9, wherein
the first cushion member and the first support member both correspond to the first support plate, and
the second cushion member and the second support member both correspond to the second support plate.

11. The display device of claim 9, wherein
each of the cushion layer and the support layer has a thickness, and the thickness of the cushion layer is the same as the thickness of the support layer.

12. The display device of claim 9, wherein
each of the plate, the support layer, and the first support plate and the second support plate has a thickness, and
the thickness of the support layer is greater than the thickness of the first support plate and the second support plate and smaller than the thickness of the plate.

13. The display device of claim 2, further comprising a second adhesive member which corresponds to the first support plate and the second support plate,
wherein
the second adhesive member extends further from the first support plate and the second support plate than the cushion layer,
each of the support layer and the second adhesive member has a thickness, and
the thickness of the support layer is smaller than the thickness of the second adhesive member.

14. The display device of claim 2, wherein each of the first support member and the second support member of the support layer is coplanar with each of the first support plate and the second support plate.

15. The display device of claim 14, wherein
each of the support layer, the first and second support plates and the cushion layer has a thickness, and
the thickness of the support layer is the same as a sum of the thickness of the first and second support plates and the thickness of the cushion layer.

16. The display device of claim 15, further comprising an insulating member which faces the first and second support plates with the cushion layer therebetween,
wherein each of the first support member and the second support member of the support layer contacts the insulating member.

17. The display device of claim 16, wherein
each of the insulating member, the first support member and the second support member has a modulus, and
the modulus of the insulating member is the same as the modulus of the first support member or the modulus of the second support member.

18. The display device of claim 14, wherein the first support member and the second support member respectively extends to define an extended portion which faces the first and second support plates with the cushion layer therebetween.

19. A display device comprising:
a display module comprising a folding area at which the display module is foldable, and a non-folding area which is adjacent to the folding area along a first direction;
a plate facing the display module, the plate comprising:
a bending portion corresponding to the folding area;
a plate portion corresponding to the non-folding area; and
a plurality of openings defined in the bending portion;
a first support plate facing the display module with the plate portion of the plate therebetween;
a first cushion member facing the plate portion of the plate with the first support plate therebetween; and
a first support member facing the display module with the bending portion of the plate therebetween,
wherein
each of the first support member and the first cushion member has a modulus, and the modulus of the first support member is greater than the modulus of the first cushion member.

20. The display device of claim 19, wherein the modulus of the first support member is equal to or greater than about 1 gigapascal.

21. The display device of claim 19, wherein
each of the folding area of the display module and the bending portion of the plate has a width along the first direction, and
the width of the folding area is the same as the width of the bending portion.

22. The display device of claim 19, wherein the first support plate comprises a metal material.

23. A display device comprising:
a display module comprising a folding area at which the display module is foldable;
a plate facing the display module, the plate comprising:
a bending portion corresponding to the folding area; and
a plurality of openings defined in the bending portion;
a first support layer facing the display module with the plate therebetween, the first support layer comprising a first support plate and a second support plate disconnected from each other at the folding area; and
a second support layer facing the plate with the first support layer therebetween, the second support layer comprising:
a first support member which faces the bending portion of the plate with the first support plate therebetween, and
a second support member which faces the bending portion of the plate with the second support plate therebetween and is disconnected from the first support member at the folding area of the display module,
wherein each of the first support member and the second support member has a modulus which is equal to or greater than about 1 gigapascal.

* * * * *